US012800680B2

(12) United States Patent
Kyles

(10) Patent No.: US 12,800,680 B2
(45) Date of Patent: Nov. 17, 2026

(54) LORENTZ-FORCE MAGNETOMETER UTILIZING PLANAR INTEGRATED ELECTRON GUN

(71) Applicant: Ian Kyles, West Linn, OR (US)

(72) Inventor: Ian Kyles, West Linn, OR (US)

( * ) Notice: Subject to any disclaimer, the term of this patent is extended or adjusted under 35 U.S.C. 154(b) by 123 days.

(21) Appl. No.: 18/792,433

(22) Filed: Aug. 1, 2024

(65) Prior Publication Data

US 2025/0044378 A1 Feb. 6, 2025

Related U.S. Application Data

(60) Provisional application No. 63/517,325, filed on Aug. 2, 2023.

(51) Int. Cl.
*G01R 33/00* (2006.01)
*G01R 33/02* (2006.01)

(52) U.S. Cl.
CPC ..... *G01R 33/0213* (2013.01); *G01R 33/0017* (2013.01)

(58) Field of Classification Search
CPC ........................ G01R 33/0213; G01R 33/0017
See application file for complete search history.

(56) References Cited

U.S. PATENT DOCUMENTS

| | | | | |
|---|---|---|---|---|
| 2003/0030778 A1* | 2/2003 | Novak | G03F 7/70841 355/75 |
| 2006/0118735 A1* | 6/2006 | Kim | H01J 37/3175 250/492.2 |
| 2006/0268455 A1* | 11/2006 | Gerber | G01R 33/07 360/112 |
| 2009/0059773 A1* | 3/2009 | Obara | G11B 7/261 369/126 |
| 2011/0037464 A1* | 2/2011 | Gurney | H10N 52/101 324/252 |
| 2017/0030849 A1* | 2/2017 | Strocchia-Rivera | G01R 27/08 |
| 2020/0072925 A1* | 3/2020 | Julian | G01R 33/243 |
| 2022/0376162 A1* | 11/2022 | Ivry | H10N 60/85 |

* cited by examiner

*Primary Examiner* — Alvaro E Fortich
*Assistant Examiner* — Trung Q Nguyen
(74) *Attorney, Agent, or Firm* — Kolisch Hartwell, P.C.

(57) ABSTRACT

A magnetic field sensing device fabricated via an integrated circuit fabrication process, incorporates a planar electron gun. The device has an evacuated chamber in which electrons emitted by cold field emission may travel on a long mean free path, with minimal collisions with atoms, ions or other obstructions. The device also has a glass or plastic window over the evacuated chamber, allowing the entry of magnetic fields, but not of air or contaminants. The device also has two or more anodes, to which nominally the same potential is applied, causing the electrons to drift or accelerate from the cathode to strike the anodes, with the number of electrons arriving at each anode being modulated by the Lorentz Force resulting from the magnetic field entering the chamber. The device also has an integrated voltage multiplier to provide a large negative potential to the cathode.

9 Claims, 3 Drawing Sheets

Top View

Fig. 1 – Top View
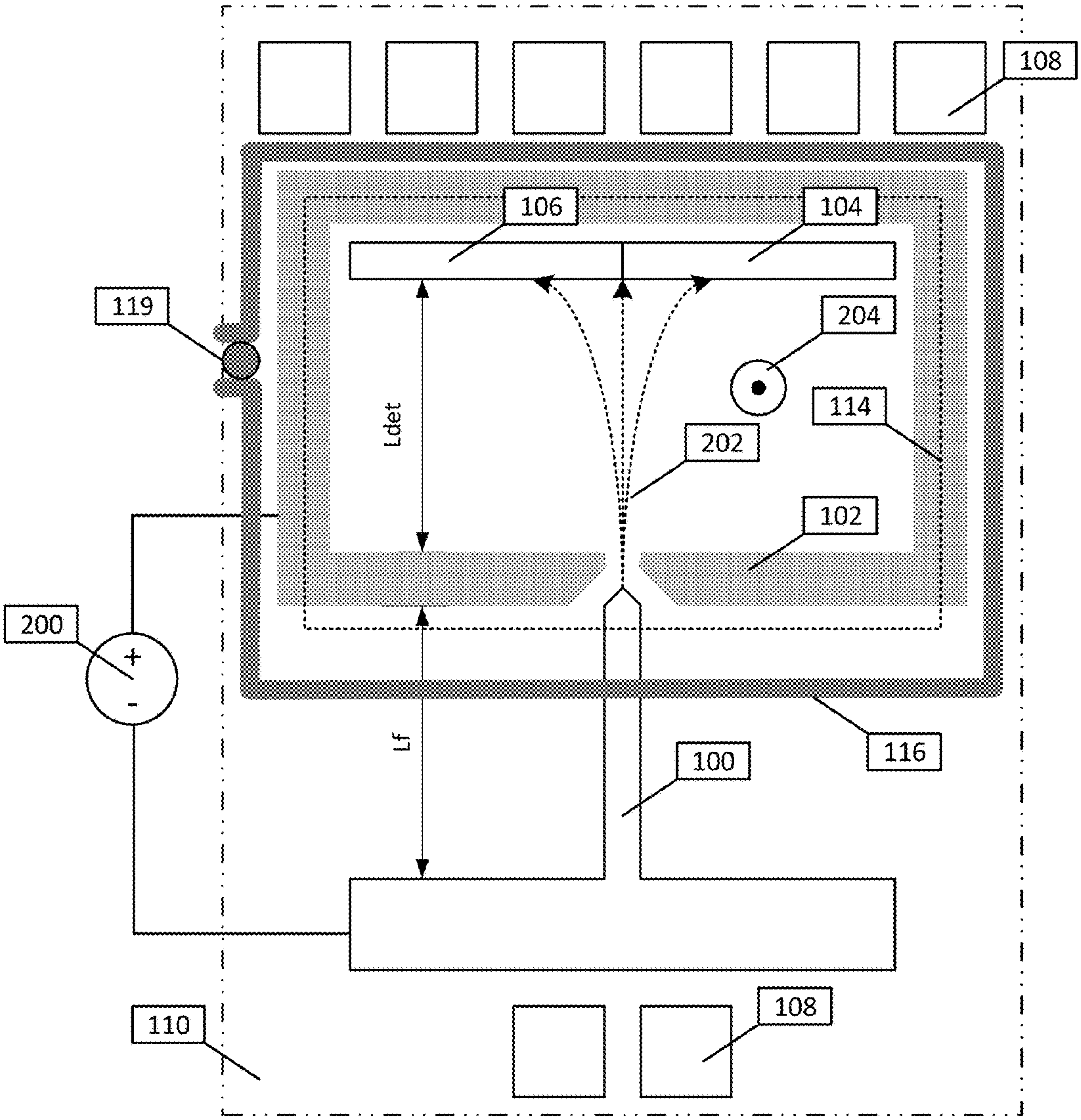

Fig. 2 – Cross-sectional View
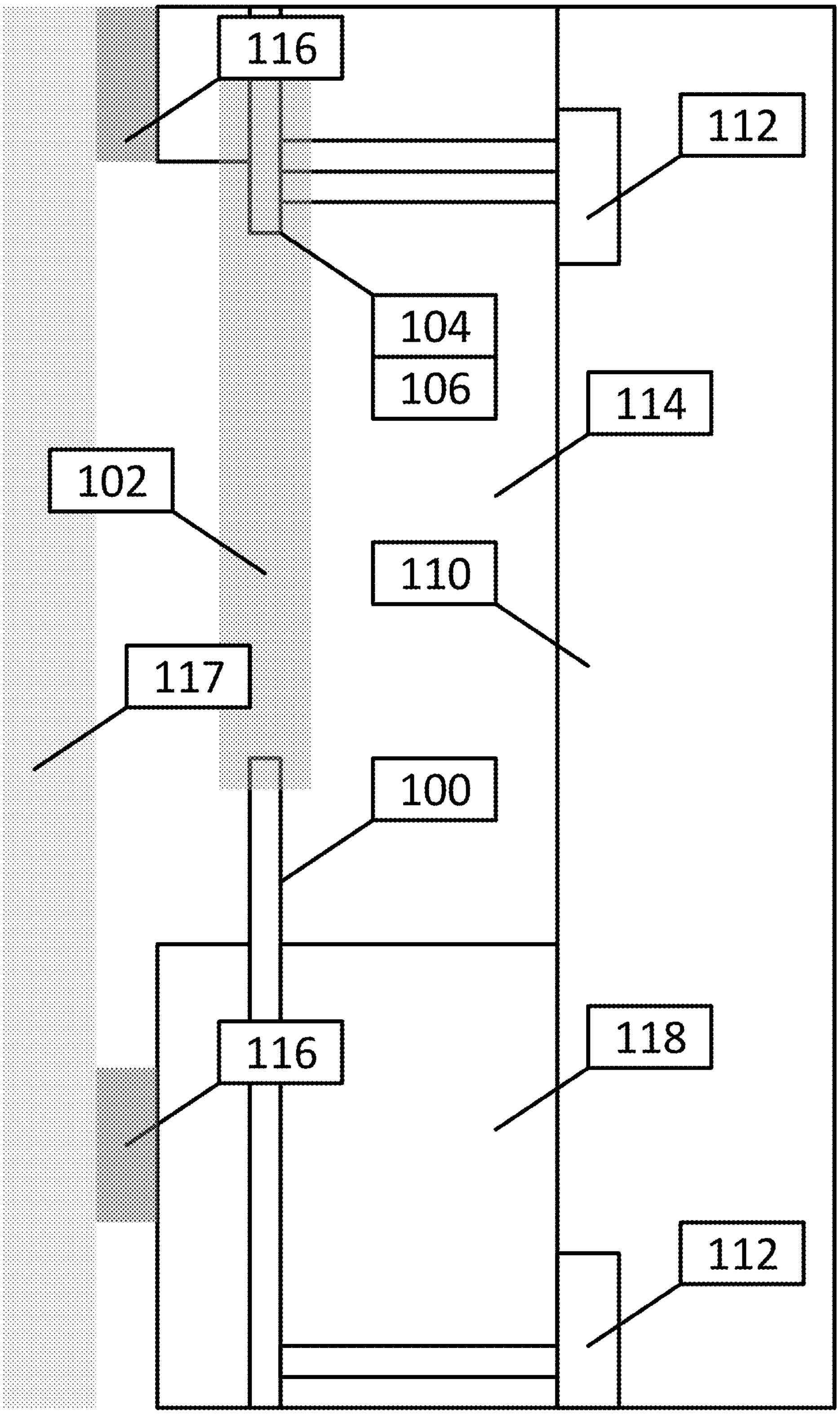

Fig. 3 – Electrical Schematic
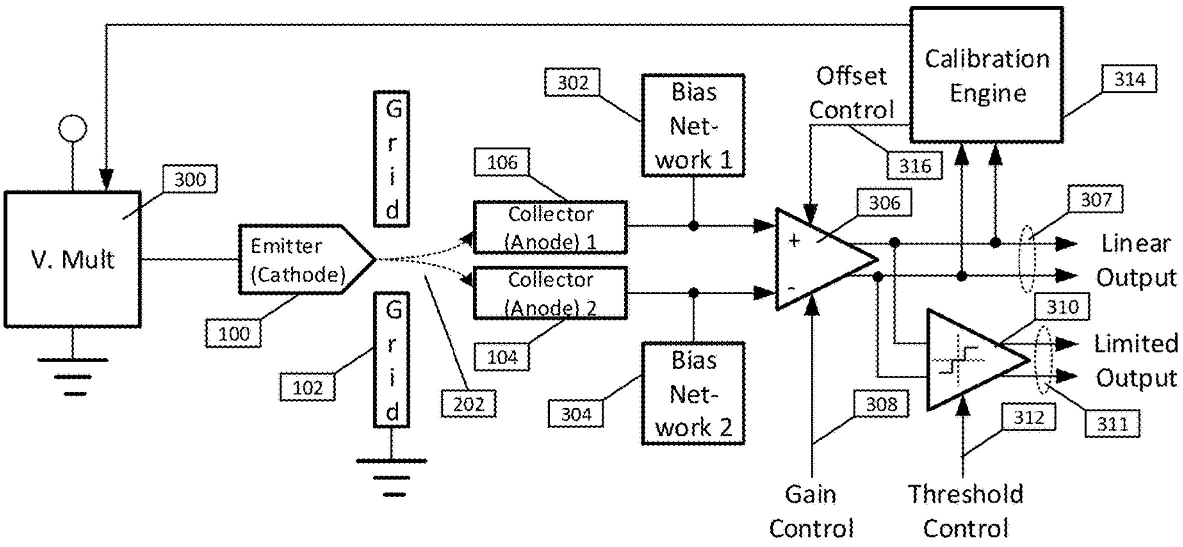

LORENTZ-FORCE MAGNETOMETER UTILIZING PLANAR INTEGRATED ELECTRON GUN

CROSS-REFERENCE TO RELATED APPLICATION

This application claims the benefit under 35 U.S.C. § 119(e) of U.S. Provisional Patent Application Ser. No. 63/517,325, filed Aug. 2, 2023 and entitled "LORENTZ-FORCE MAGNETOMETER UTILIZING PLANAR INTEGRATED ELECTRON GUN", the disclosure of which is herein incorporated by reference.

BACKGROUND OF THE INVENTION

Magnetic sensing is utilized in a variety of applications, whether stand-alone or in mobile devices. Examples of those applications include the following: (i) proximity sensing of objects in a wide variety of fields (industrial, automotive, computing); (ii) position and movement sensing in machine-control applications; (iii) detection of fields from hidden electrical wires; (iv) detection of hidden metal objects in security applications; (v) detection of fields generated by neurons in biomedical applications; (vi) detection of brain waves in brain-computer interface applications; (vii) detection of magnetic domains on tape and disk drives for computer storage; and (viii) detection of the earth's magnetic field in compasses.

Conventional magnetic sensors have limitations, including: physical size, cost, fabrication repeatability, low sensitivity, power consumption and frequency response to changing fields. Removing one or more of these limitations broadens the applications for the sensor, not only making it more desirable than conventional ones, but opening up new applications such as: (i) making more sensitive field detection possible in hand-held and wearable devices; (ii) making arrays of sensors in a smaller area to allow for more rapid measurements without moving the sensor; (iii) sensing weaker fields such as the propagation of action potentials in peripheral nerves and brain neurons without invasive connections or uncomfortable skin-contact electrode connections; (iv) sensing more rapidly-moving machinery parts than previously possible; (v) sensing objects or currents at a greater distance; (vi) improved-accuracy position sensing; (vii) finger- and hand-motion sensing for gestural interfaces in mobile computing; (viii) increased-capability magnetic compasses in mobile devices; and (ix) antenna-less AM and FM radio reception.

The present invention (while it is referred to below in the singular, this disclosure includes several inventions) overcomes the prior limitations to provide a low-cost, compact, extremely sensitive and high-bandwidth magnetic-field detector.

BRIEF DESCRIPTION OF THE DRAWINGS

FIGS. 1-3 are described below, and are also shown below, after the word description. They are also included in the accompanying document.

DESCRIPTION OF THE INVENTION

The device of the invention is fabricated using a standard integrated circuit (IC) fabrication process providing multiple layers of interconnect metal, transistors (Bipolar or Field-effect), and resistors and capacitors on a silicon or III-V semiconductor substrate. The process of the invention is used to fabricate a Planar Electron Gun and supporting power, amplification and adjustment circuits. A final special step in the fabrication process applies a printed or deposited adhesive seal with a small opening on one side, pressing on a pre-fabricated glass layer then entering the assembly into a vacuum chamber, evacuating the air and sealing the small opening with more adhesive, to provide certain enclosed, evacuated areas. The ICs and the glass layer may be sawn ("singulated") together resulting in an IC with an embedded vacuum chamber.

The Planar Electron Gun uses Cold Field Emission (CFE) to stimulate emission of electrons from a shaped Cathode or Emitter using a nearby Grid, and allowing some proportion of those electrons to pass into a vacuum-filled open area or Cavity formed by etching out the dielectric of the IC interconnect process. The emitted electrons drift due to an applied field to a pair or plurality of Anodes or Collectors where they are collected. The use of an IC fabrication process enables close spacing and high sharpness of certain electrodes, leading to high Field Enhancement Factor (FEF) (for example 100-500×) to achieve CFE with a usable emission current (example 10-100 uA) at reasonably attainable voltages (for example 5-20V).

Unlike most CFE applications, such as plasma displays, the electron gun structure has the emitter and electron flow parallel to the device substrate, rather than emitting vertically, and is thus more conducive to realization in an IC process.

The Lorentz Force states that a charge moving horizontally along a Y-axis, acted upon by a vertical (Z-axis) magnetic field will experience a horizontal force (in the X axis), according to the equation $F=qE+qv\times B$, where:

q is the charge
B is the magnetic field
v is the velocity of the charge
E is the electric field Therefore, a stream of electrons traveling past the grid towards the Anodes will develop a curved trajectory related to the strength and polarity of the applied magnetic field, and the number of electrons collected at each Anode will vary creating differences in collected current and potential which can be detected to provide a reading of the field strength.

This is somewhat analogous to the Hall Effect in semiconductors and conductors where electrons flowing in the material due to a potential difference in the Y axis, will collect more one on side or the other in the X-axis due to a magnetic field in the Z axis. However, the present invention utilizes the Lorentz force in purer form. Due to the free movement of the electrons in vacuum (giving high Mobility) greater sensitivity to the magnetic field and higher frequency response are achieved, at a lower power dissipation and in smaller area.

Further understanding of the invention is gained by an examination of the Figures shown below in combination with the following description.

In FIG. 1 the Cathode [100] is given a negative potential via voltage source [200], (which may be an externally-applied voltage or an on-chip voltage multiplier aka charge pump), with respect to Grid [102]. The shape of the anode and ratio of tip radius to distance Lf provide a sufficient FEF to stimulate CFE from the Anode, producing electrons [202] which drift towards Anodes [104],[106] which have a positive potential with respect to the Grid. Magnetic field [204] (shown here with the symbol for a field going into the page)

deflects the electrons' paths as they travel over distance Ldet, according to the Lorentz Force, causing them to preferentially arrive at Anode [104] or [106] depending on the magnetic field polarity and strength. The entire structure is fabricated on a semiconductor or insulator substrate [110] (such as Silicon or Sapphire) which is contacted for the purposes of supplying power, control and input/output means through wire-bond pads [108] or other similar connections, such as solder balls or copper pillars.

FIG. 2 provides a side view of the structure revealing additional detail. In substrate [110], integrated circuitry [112] is fabricated by common IC processing steps to form circuits for developing the potential differences between Cathode [100], Grid [102] and Anodes [104],[106], and detecting the arrival of electrons and amplifying the CFE current flow to produce a detected signal. The Cathode, Grid and Anodes are physically supported by dielectric [118] (such as Silicon Dioxide, Glass or organic dielectric such as BCB) except in evacuated region [114] where the dielectric is etched away or omitted (not deposited) during fabrication. A sealing layer [116] of dielectric or adhesive material, is applied by either printing from a dispensing nozzle or by transfer from a surface onto which it has been previously printed or deposited, and is patterned as a nearly-closed shape [116] on top of the IC dielectric [118] forming an enclosure around the cavity region [114]. First, a plate of glass [117] is applied over the sealing layer, and there is singulation of the sensor device (for instance by sawing the whole structure out of a wafer). Then, the resulting chamber is evacuated in a vacuum (i.e. sawing into individual sensors) and sealed (by dispensing a last drop of adhesive [119] in the open part of the shape [120] while in vacuum). That part of the process excludes air and contaminants, and allows electrons the maximum possible mean-free path (distance without encountering an atom or ion with which it would collide) because they are traveling in a vacuum. In another embodiment, substrate [110] could be glass or other dielectric or insulator, and the circuitry [112] could reside on a separate semiconductor die that connects to the remaining elements via bond wires or other connection means.

FIG. 3 provides a block diagram of the entire integrated circuit divided by functions. Voltage multiplier [300] provides a negative potential, and source of electrons to Emitter (Cathode) [100]. Electrons [202] are emitted via CFE due to the electric field between the Cathode and the Grid [102], which is at ground potential. Electrons are collected in varying amounts at Collectors (Anodes) [104],[106], which are biased at a positive potential by bias networks [302], [304]. The potential difference resulting from the differing number of arriving electrons at Anodes [104], [106] is amplified with amplifier [306], which may be a high-gain operational amplifier or a trans-impedance amplifier, having a gain control input [308]. The raw, linear differential output [307] of the amplifier may be used for some purposes, but a 3-state limiting amplifier [310] is also provided to produce a saturated, digital output [311] with values of +1, 0, and −1, with the following mapping:

+1, for input>+threshold 0, for +threshold>input>−threshold

−1, for input<−threshold

Thus, the digital output will indicate the sign of the applied magnetic field, but will be "muted" for differences smaller than the threshold, set by the threshold control [312].

Calibration Engine [314] is a logic block which will perform an offset nulling at power-up, disabling the Voltage Multiplier [300], sampling the linear output [307] and adjusting offset control [316] digital word to control and internal offset Digital-to-Analog converter inside amplifier [306] until signal [307] is within some target tolerance of 0 differential voltage (the nulled state).

The foregoing descriptions of specific embodiments of the present invention have been presented for purposes of illustration and description. They are not intended to be exhaustive or to limit the present invention to the precise forms disclosed, and obviously many modifications and variations are possible in light of the above teaching. The embodiments were chosen and described in order to best explain the principles of the present invention and its practical application, and to thereby enable others skilled in the art to best utilize the present invention and various embodiments with various modifications as are suited to the particular use contemplated. It is understood that various omissions and substitutions of equivalents are contemplated as circumstances may suggest or render expedient, but such omissions and substitutions are intended to cover the application or implementation without departing from the spirit or scope of the present invention.

What is claimed:

1. A magnetic field sensing device utilizing an electron flow for sensing a magnetic field, the magnetic field sensing device fabricated via an integrated circuit fabrication process on a substrate defining a planar surface, the magnetic field sensing device incorporating a planar electron gun wherein the planar electron gun includes a cathode fabricated on the substrate and a first anode and a second anode fabricated on the substrate, the cathode and the anodes relatively positioned on the substrate for the electron flow to travel parallel to the planar surface of the substrate from the cathode to the anodes, the first anode and the second anode positioned relative to one another to sense the magnetic field's effect on the electron flow.

2. The device of claim 1, having an evacuated chamber in which electrons emitted by cold field emission may travel on a long mean free path with minimal collisions with atoms, ions or other obstructions.

3. The device of claim 1, having a glass or plastic window over the evacuated chamber, either affixed to the die or as part of an IC package, allowing the entry of magnetic fields, but not of air or contaminants, such that the traveling electrons may be acted upon by the Lorentz Force.

4. The device of claim 1, having two or more anodes, to which nominally the same potential is applied, to cause the electrons to drift or accelerate from the cathode to strike the anodes with the number of electrons arriving at each Anode being modulated by the Lorentz Force resulting from the magnetic field entering the chamber.

5. The device of claim 1, having an integrated voltage multiplier to provide a large negative potential to the cathode.

6. The device of claim 1, having an operational amplifier or trans-impedance amplifier which can amplify the difference in potentials or current flow between Anodes that result from collection of differing numbers of electrons.

7. The amplifier of claim 6, having a means to calibrate away any offset, when power is first applied to the device or subsequently, either in the presence or absence of electron flow.

8. The amplifier of claim 6, having an analog- or digital-input gain control to adjust the sensitivity and full-scale deflection limit of the device.

9. The device of claim 1, having a limiting amplifier with intentional dead zone, to convert the analog output of the amplifier of paragraph 6 into a differential binary output, with a third output state of zero differential voltage when its input is less than some programmable threshold.

* * * * *